United States Patent
May et al.

(10) Patent No.: US 7,835,461 B2
(45) Date of Patent: *Nov. 16, 2010

(54) LOW POWER RADIO TRANSMITTER USING PULSE TRANSMISSIONS

(75) Inventors: Michael May, Austin, TX (US); Michael David Cave, Pflugerville, TX (US); James W. Girardeau, Jr., Austin, TX (US); Mathew A. Rybicki, Austin, TX (US)

(73) Assignee: ViXS Systems, Inc., Toronto, Ontario (CA)

( * ) Notice: Subject to any disclaimer, the term of this patent is extended or adjusted under 35 U.S.C. 154(b) by 52 days.

This patent is subject to a terminal disclaimer.

(21) Appl. No.: 11/281,164

(22) Filed: Nov. 16, 2005

(65) Prior Publication Data

US 2006/0067423 A1    Mar. 30, 2006

Related U.S. Application Data

(63) Continuation of application No. 10/041,230, filed on Jan. 7, 2002, now abandoned.

(51) Int. Cl.
   *H04L 27/04* (2006.01)
(52) U.S. Cl. .................................. 375/295
(58) Field of Classification Search ................ 375/295, 375/298, 300; 455/91, 102, 108; 332/108, 332/115
See application file for complete search history.

(56) References Cited

U.S. PATENT DOCUMENTS

| | | | | |
|---|---|---|---|---|
| 4,431,977 A | * | 2/1984 | Sokola et al. | 333/206 |
| 4,527,276 A | * | 7/1985 | Gutleber | 375/239 |
| 5,251,330 A | * | 10/1993 | Chiba et al. | 455/91 |
| 5,396,244 A | * | 3/1995 | Engel | 341/143 |
| 5,488,631 A | * | 1/1996 | Gold et al. | 375/145 |
| 5,946,120 A | * | 8/1999 | Chen | 398/155 |
| 6,014,055 A | * | 1/2000 | Chester | 330/10 |
| 6,519,259 B1 | * | 2/2003 | Baker et al. | 370/395.4 |
| 6,683,918 B2 | * | 1/2004 | Jackson et al. | 375/308 |
| 6,993,087 B2 | * | 1/2006 | Rosnell et al. | 375/295 |

* cited by examiner

*Primary Examiner*—Chieh M Fan
*Assistant Examiner*—Jaison Joseph
(74) *Attorney, Agent, or Firm*—Garlick Harrison & Markison; Bruce E. Stuckman (57) ABSTRACT

A low power radio transmitter includes an intermediate frequency stage, signal-to-pulse conversion module, and a power amplifier. The intermediate frequency stage up-converts the frequency of a base-band digital signal into an N-bit signal at the intermediate frequency. The signal-to-pulse conversion module converts the N-bit signal at the intermediate frequency into a pulse signal of M-bits at the radio frequency. As such, the signal-to-pulse conversion module is taking an N-bit signal (e.g., an 8-bit digital signal) and converting it into an M-bit pulse signal (e.g., a 1-bit pulse stream). Accordingly, the M-bit signal at the radio frequency is essentially a square-wave, which has a peak to average ratio of zero, is subsequently amplified by the power amplifier.

13 Claims, 7 Drawing Sheets

FIG. 1

FIG. 2
IF stage 22

FIG. 7
pulse width generator 116

FIG. 8
pulse width generator 116

LOW POWER RADIO TRANSMITTER USING PULSE TRANSMISSIONS

This patent application is claiming priority under 35 USC §120 as a continuing patent application of co-pending patent application entitled LOW POWER RADIO TRANSMITTER USING PULSE TRANSMISSIONS, having a filing date of Jan. 7, 2002, and a Ser. No. 10/041,230 now abandoned.

TECHNICAL FIELD OF THE INVENTION

This invention relates generally to radio technology and more particularly to radio transmitters.

BACKGROUND OF THE INVENTION

Radio transmitters are known to include a modulator, frequency up-converter, and a power amplifier to drive an antenna. While the basic structure of a radio transmitter is common over various applications, the particular construction of the elements of a radio transmitter is application dependent. For example, an IEEE 802.11a compliant radio transmitter includes a modulator that modulates incoming data utilizing binary phase shift keying (BPSK), quadrature phase shift keying (QPSK), 16 QAM (quadrature amplitude modulation) or 64 QAM in an orthogonal frequency division multiplex (OFDM) manner to produce modulated data. The frequency up-converter converts the base-band modulated data directly, or through an intermediate frequency stage, to a radio frequency signal having a frequency band in the 5-gigahertz range.

The power amplifier is designed to accurately amplify RF signals and to drive an antenna. An RF signal typically includes peaks that occur infrequently and has an average value that is significantly less than the peak. Note that for sinusoidal based signals, the average value is generally measured as an rms value. For example, an IEEE 802.11a compliant RF signal has a peak occurring every 50,000-100,000 symbols, but the average value is much less, yielding a significant peak-to-average ratio (e.g., 10-20 dB). Despite the infrequency of the peaks that are significantly greater than average values, a power amplifier must be designed to accurately accommodate the peak conditions as if they were frequent events. For instance, to support an average power transmission of 200 milliwatts (mW), with a peak-to-average ratio of 15 dB, the power amplifier should be a 6.3 Watt amplifier. As such, the power amplifier is generally running much below its capabilities, but is designed to handle the peak conditions. Aggressive system design can run the power amplifier at lower power so that peaks are distorted. This will increase the system error rate or require that the remainder of the system be higher performance, so that the total system performance is acceptable.

By having to design power amplifiers to handle signals with a large peak-to-average ratio, the average operating point must be a sufficient distance from the 1 dB compression point, which is approximately the point where the power amplifier loses linearity. Such power amplifiers consume more power than power amplifiers that have average operating points closer to the 1 dB compression point, are typically more expensive to construct, especially on integrated circuits, and/or have less range of operation.

On the receiving end of a radio, the receiver includes complementary components to radio transmitter. Thus, any changes made to the radio transmitter will most likely require a complementary change to the radio receiver.

Therefore, a need exists for improved power amplification of RF signals to reduce cost, to reduce power consumption, and/or to increase range of operation such that a lower power consuming transmitter may be obtained for various wireless communication standards including IEEE 802.11.

DETAILED DESCRIPTION OF A PREFERRED EMBODIMENT

Generally, the present invention provides a low power radio transmitter that includes an intermediate frequency stage, signal-to-pulse conversion module, and a power amplifier. The intermediate frequency stage up-converts the frequency of a base-band digital signal into an N-bit signal at the intermediate frequency (i.e., the signal energy of the N-bit signal is centered at DC offset by the IF). The frequency up-conversion includes mixing in-phase and quadrature components of the base-band digital signal with in-phase and quadrature components of a local oscillator. The signal-to-pulse conversion module converts the N-bit signal at the intermediate frequency into a pulse signal of M-bit at the radio frequency (i.e., the signal energy of the M-bit signal is centered at RF). For example, the signal-to-pulse conversion module may use pulse-width modulation, pulse-density modulation, or pulse-position modulation to produce the pulse signal at the radio frequency. As such, the signal-to-pulse conversion module is taking an N-bit signal (e.g., an 8-bit digital signal) and converting it into an M-bit pulse signal (e.g., a 1-bit pulse stream). Accordingly, the M-bit signal at the radio frequency is essentially a square-wave, which is subsequently amplified by the power amplifier. With the power amplifier amplifying square-wave signals, the peak-to-average ratio of the signal is zero. Thus, the power amplifier may be designed to be a low-power power amplifier, have greater operating range, and be less expensive than power amplifiers used in radio transmitters that have a peak-to-average ratio greater than zero.

Figure 1:
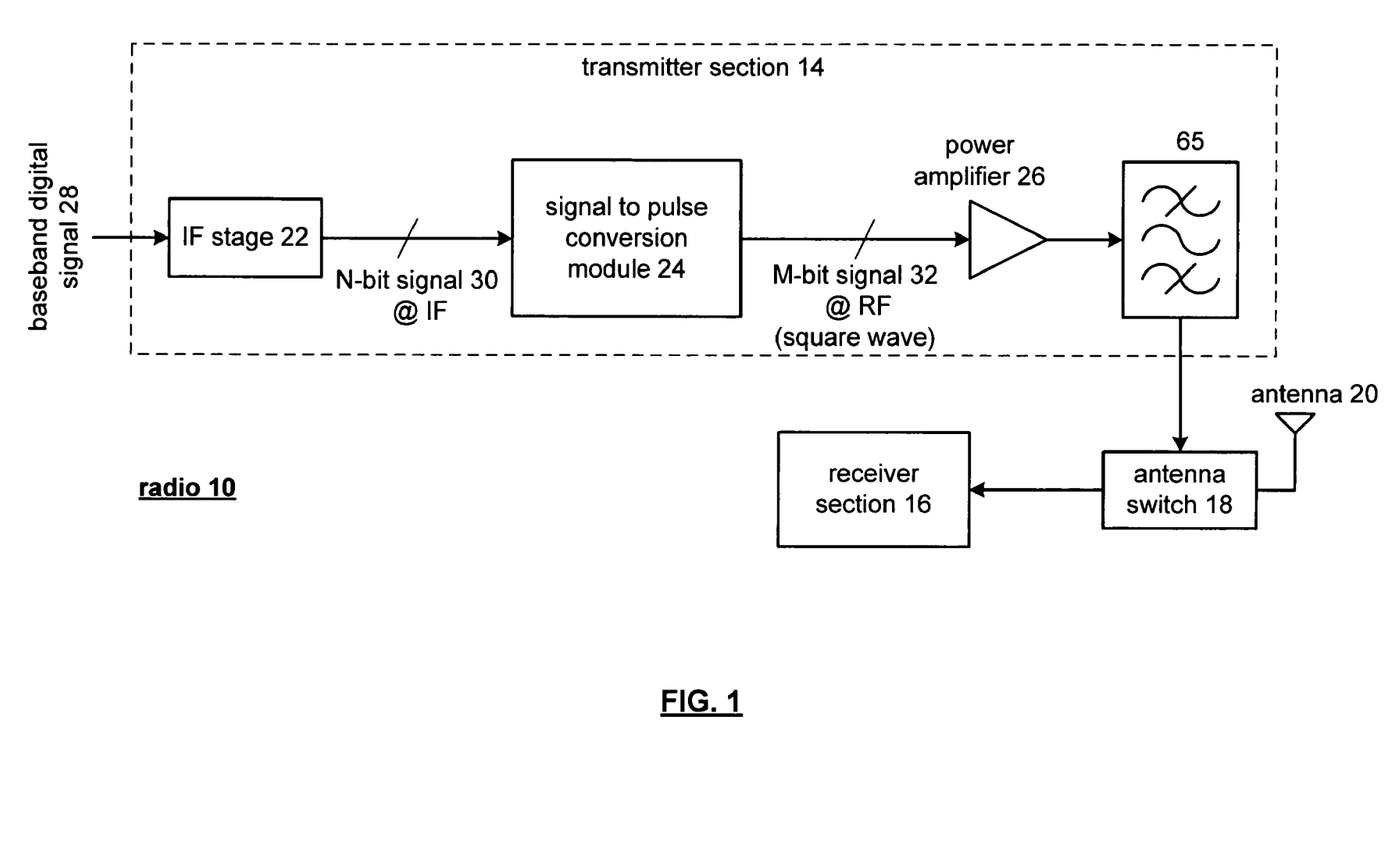
FIG. 1 illustrates a schematic block diagram of a radio in accordance with the present invention.

The present invention can be more fully described with reference to FIGS. 1-10. FIG. 1 illustrates a radio 10 in accordance with the present invention. The radio 10 includes a transmitter section 14, receiver section 16, antenna switch 18 and an antenna 20 and may be constructed to operate in accordance with one or more wireless communication standards including, but not limited to, IEEE 802.11a, IEEE 802.11b, Bluetooth, advanced mobile phone services (AMPS), digital AMPS, global system for mobile communications (GSM), code division multiple access (CDMA), wireless application protocols (WAP), local multi-point distribution services (LMDS), multi-channel multi-point distribution systems (MMDS), and/or variations thereof. The transmitter section 14 includes an intermediate frequency stage 22, a signal-to-pulse conversion module 24, a power amplifier 26, and a bandpass filter 65.

In operation, the transmitter section 14 receives a base-band digital signal 28 via the intermediate frequency stage 22, which converts it into an N-bit signal 30 at an intermediate frequency. In essence, as will be described in greater detail with reference to FIG. 2, the intermediate frequency stage 22 mixes a local oscillation with the base-band digital signal to produce the N-bit signal 30 at the intermediate frequency. Note that N may correspond to any number from 4 to 32 bits. Further note that the N-bit signal at the intermediate frequency is essentially the baseband signal 28 with its signal energy shifted to the intermediate frequency. Still further note that the intermediate frequency is substantially less than the radio frequency, thus the N-bit signal 30 at the intermediate frequency, with respect to high frequencies, looks like a DC signal offset slightly by the intermediate frequency.

The signal-to-pulse conversion module 24 converts the N-bit signal 30 at the intermediate frequency into an M-bit signal 32 at a radio frequency (i.e., the signal energy is shifted from DC offset by IF to RF). In essence, the signal-to-pulse conversion module 24 is decreasing the number of bits of the signal (e.g., from eight to one) and increasing the carrier frequency of the signal from the intermediate frequency to the radio frequency. For example, the radio frequency may be 900 megahertz for cordless telephones, 2.4 gigahertz for 802.11b or Bluetooth compliant transmission, and/or 5.6 gigahertz for 802.11a compliant transmissions.

The signal-to-pulse conversion module 24 may utilize pulse-density modulation, pulse-width modulation or pulse-position modulation to encode the N-bit signal into an M-bit pulse signal 32. The various embodiments of the signal-to-pulse conversion module 24 will be described in greater detail with reference to FIGS. 3-8.

The power amplifier 26 amplifies the M-bit signal 32 at the radio frequency and provides the amplified signal to the bandpass filter 65, which in turn, provides a filtered RF signal to the antenna switch 18. Correspondingly, the antenna 20 transmits the filtered M-bit signal 32 at the radio frequency. The bandpass filter 65, as will be described in greater detail with reference to FIG. 3, filters the M-bit signal 32 at RF to substantially reduce signal energy at all frequencies outside the bandwidth of the bandpass filter. This reduces the quantization noise associated with the M-bit signal 32 that is not near the RF carrier frequency. As such, the input impedance of the bandpass filter 65 substantially matches the impedance of the antenna at RF, but is very large at other frequencies. Thus, the power amplifier 26 is only driving a significant load at the RF carrier frequency.

In addition, by pulse encoding the radio frequency signal, the power amplifier will have a low peak-to-average ratio (e.g., zero for a 1-bit pulse encoded signal), will consume less power, will have a greater range of operation, and/or will be less costly than power amplifiers that transmit RF signals having a relatively substantial peak to average ratio (e.g., greater than 10 dB). As one of average skill in the art will appreciate, the power amplifier 26 may be implemented in a variety of ways including, but not limited to, a Class A amplifier, a power inverter, a transistor pull-up and/or transistor pull-down circuit, or a comparator that compares the M-bit signal at the radio frequency with a reference to produce an amplified M-bit signal.

Figure 2:
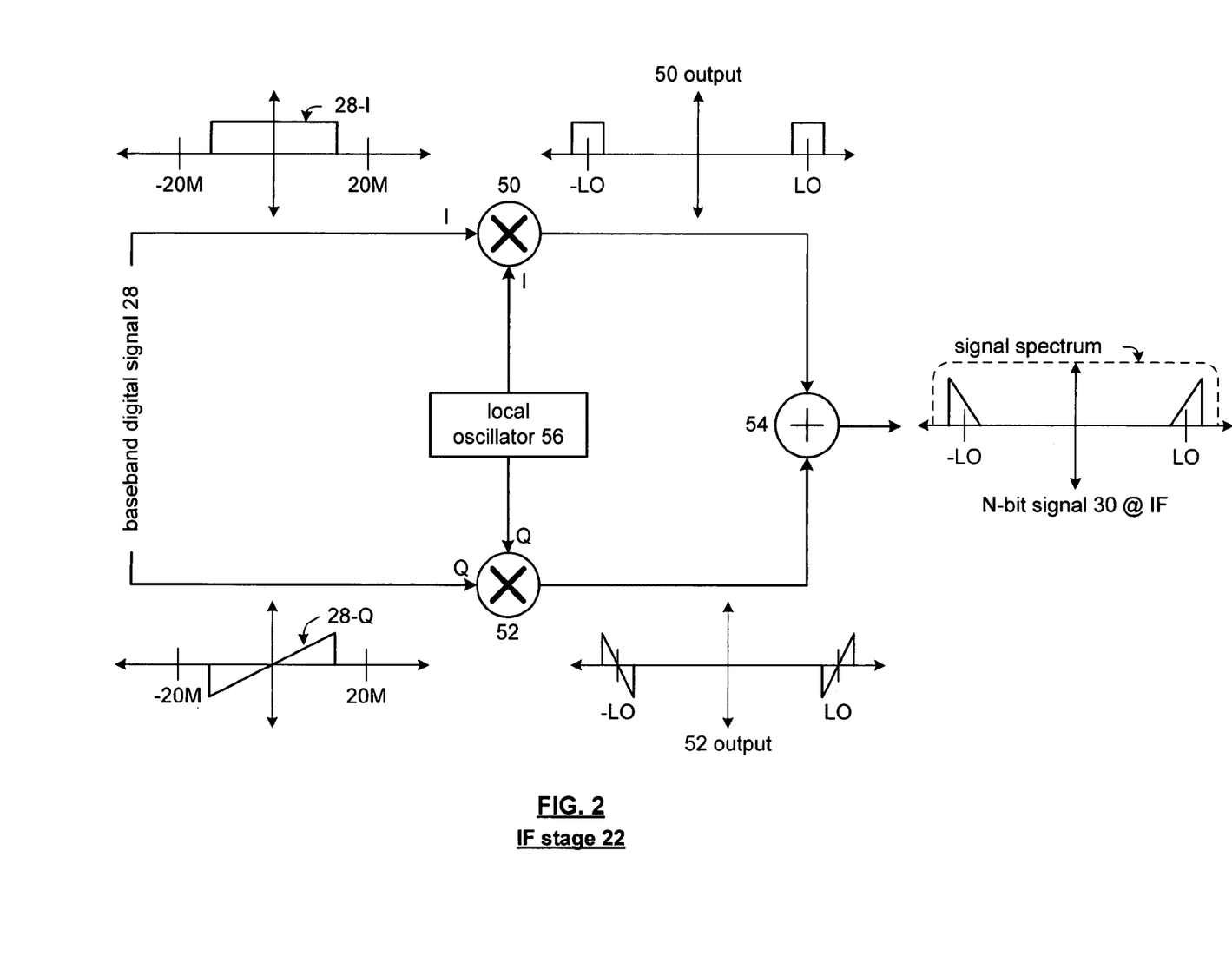
FIG. 2 illustrates a schematic block diagram of an intermediate frequency stage of a radio transmitter in accordance with the present invention.

FIG. 2 illustrates a schematic block diagram of the intermediate frequency (IF) stage 22 and corresponding frequency domain representations of the signals processed by the IF stage 22. The intermediate frequency stage 22 includes a $1^{st}$ mixing module 50, $2^{nd}$ mixing module 52, summing module 54 and a local oscillator 56. The local oscillator 56 generates an in-phase intermediate frequency signal, which is provided to the $1^{st}$ mixing module, and a quadrature intermediate frequency, which is provided to the $2^{nd}$ mixing module.

The $1^{st}$ mixing module also receives an in-phase component of the base-band digital signal 28. The frequency domain representation of the in-phase component of the base-band digital signal 28 is shown adjacent to the corresponding input of the $1^{st}$ summing module. As shown, the in-phase component of the base-band digital signal 28 is a relatively low frequency signal that is an even function centered about DC, indicating that it is a real signal.

The $2^{nd}$ mixing module 52 receives the quadrature component of the base-band digital signal 28. The frequency domain representation of the quadrature component of the base-band digital signal 28 is shown adjacent to the corresponding input of the $2^{nd}$ mixing module 52. As shown, the quadrature component of base-band digital signal 28 is an odd function with respect to DC and is centered around DC, indicating that it is an imaginary signal.

The $1^{st}$ mixing module 50 mixes the in-phase component of the base-band digital signal 28 with the in-phase component of the local oscillator to produce a mixed signal. The mixed signal is shown as the output of the $1^{st}$ mixing module 50. The frequency domain representation of this mixed signal is shown adjacent to the output of mixer 50. As shown, the signal is now shifted in frequency to the local oscillation frequency, or intermediate frequency.

The $2^{nd}$ mixing module 52 mixes the quadrature component of the base-band digital signal 28 with the quadrature component of the local oscillator 56. The frequency domain representation of the output of the $2^{nd}$ mixing module 52 is shown to have the odd function shifted in frequency based on the local oscillation frequency.

The summing module 54 sums the output of the $1^{st}$ mixing module 50 with the output of the $2^{nd}$ mixing module 52. The resulting signal is the N-bit signal 30 at the intermediate frequency. As shown, the signal is symmetrical about DC frequency and has a signal spectrum of approximately equal to twice the local oscillation frequency, i.e., the intermediate frequency. However, with respect to the radio frequency, the intermediate frequency is so small that the N-bit signal at the IF appears as a signal centered at DC, just slightly offset by the intermediate frequency. For example, if the intermediate frequency is 120 MHz and the radio frequency is 5.6 GHz, the IF is approximately $1/47^{th}$ of the RF.

Figure 3:
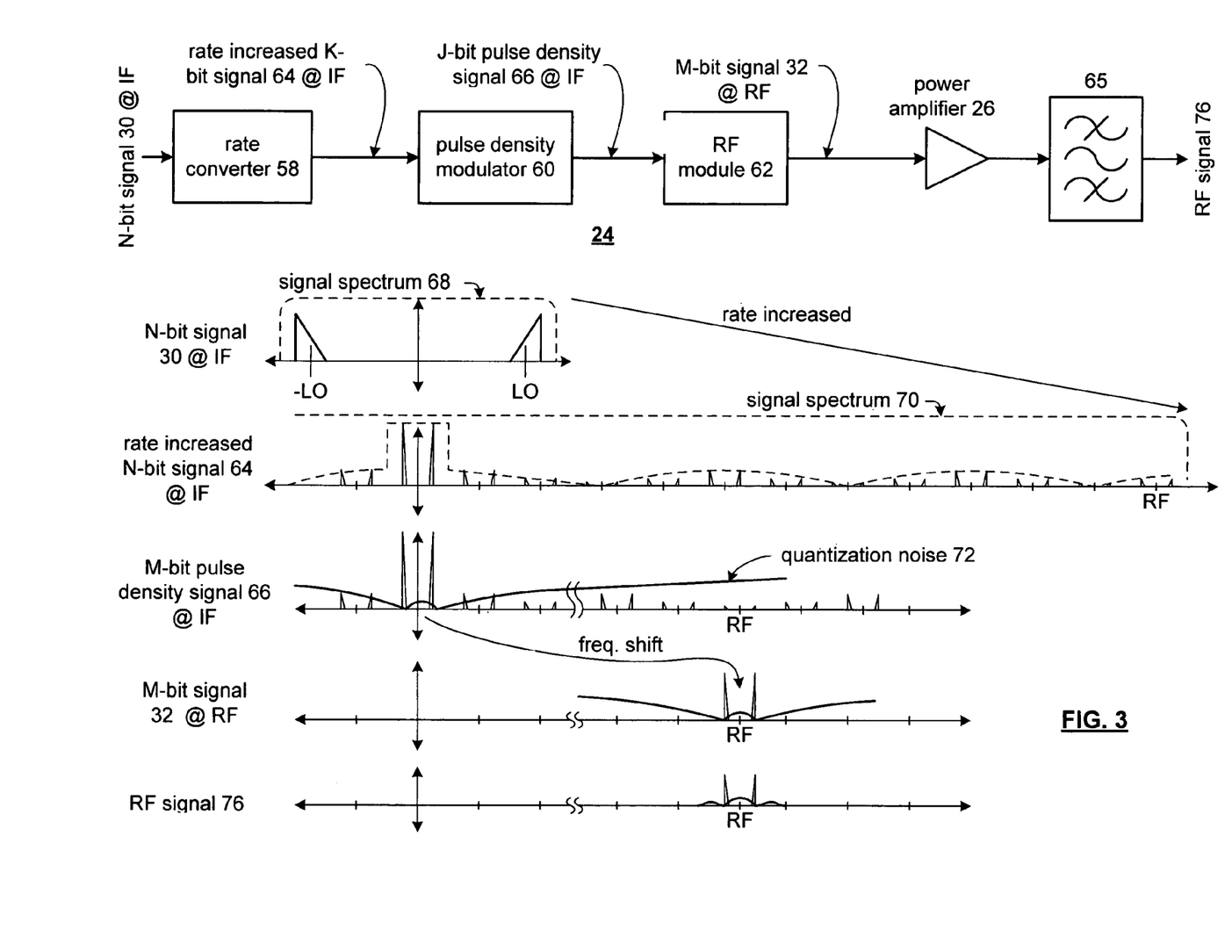
FIG. 3 illustrates a schematic block diagram of a signal-to-pulse conversion module in accordance with the present invention.

FIG. 3 illustrates a schematic block diagram of an embodiment of the signal-to-pulse conversion module 24 and corresponding frequency domain representation of the signals produced thereby. The signal-to-pulse conversion module 24 includes a rate converter 58, a pulse-density modulator 60, and a radio frequency module 62. The radio frequency module 62 is operably coupled to power amplifier 26, which in turn, is coupled to a band-pass filter 65, which may be a ceramic bandpass filter.

The rate converter 58 receives the N-bit signal 30 at the intermediate frequency and increases its rate to produce a rate increased K-bit signal 64 at the intermediate frequency, where K may range from 4 to 32 bits. As shown in the corresponding frequency domain representation of the signals, the N-bit signal 30 at the intermediate frequency is centered about DC with signal energies at the local oscillator frequency. The signal spectrum 68 of the N-bit signal 30 essentially spans twice the local oscillation frequency.

The rate increased K-bit signal 64 at the intermediate frequency is shown to increase the signal spectrum 70 based the rate of increase, but the signal still centered at DC offset by the intermediate frequency. As illustrated, the signal energy is greatest at DC and is filtered in a repeating pattern due the filtering properties of the rate converter 58. In the time domain, the rate converter 58 over samples and filters the N-bit signal 30 at the intermediate frequency to produce the rate increased K-bit signal 64 at the intermediate frequency. For example, the over sampling performed by the rate converter 58 may range from an over sampling of 8 to an over sampling of 256. In general, the rate of the over sampling of the rate converter 58 to produce the rate increased K-bit signal 64 will correspond to the sampling frequency used by the pulse-density modulator 60.

The pulse-density modulator 60 converts the rate increased K-bit signal 64 at the intermediate frequency into a J-bit pulse-density signal 66 at the intermediate frequency, where J ranges from 1 to 4. In essence, the pulse-density modulator 60 is converting the digital signal into a pulse-density signal. The frequency domain representation of the J-bit pulse-density signal 66 at the intermediate frequency includes the signal energy centered at DC offset by the intermediate frequency and repeated numerous times up to and including at the radio frequency. In addition, the energy of the J-bit pulse-density signal 66 includes quantization noise 72, which results from the pulse density modulation function.

The RF module 62 receives the J-bit pulse-density signal 66 at the intermediate frequency and up-converts the frequency to produce the M-bit signal 32 at the radio frequency. In essence, the RF module 62 is shifting the J-bit pulse density signal 66 from being centered at DC, offset by the IF, to being centered at the radio frequency. The frequency domain representation of the M-bit signal 32 at the radio frequency is represented to have the signal now centered at the radio frequency with the quantization noise spanning over various frequencies.

The power amplifier 26 amplifies the M-bit signal 32 and provides it to the band-pass filter 65. The band-pass filter 65 filters the M-bit signal 32 and produces RF signal 76. The frequency domain representation of the RF signal 76 is illustrated as having the quantization noise substantially attenuate outside of the frequency band surrounding the RF frequency. This is generally achieved because the bandpass filter 65 includes a filtering arrangement such that, at frequencies outside of a small range around the RF carrier frequency, the filter 65 has a very high impedance and, at frequencies within the small range around the RF carrier frequency, the filter 65 has an impedance that substantially matches the impedance of the antenna 20.

Figure 4:
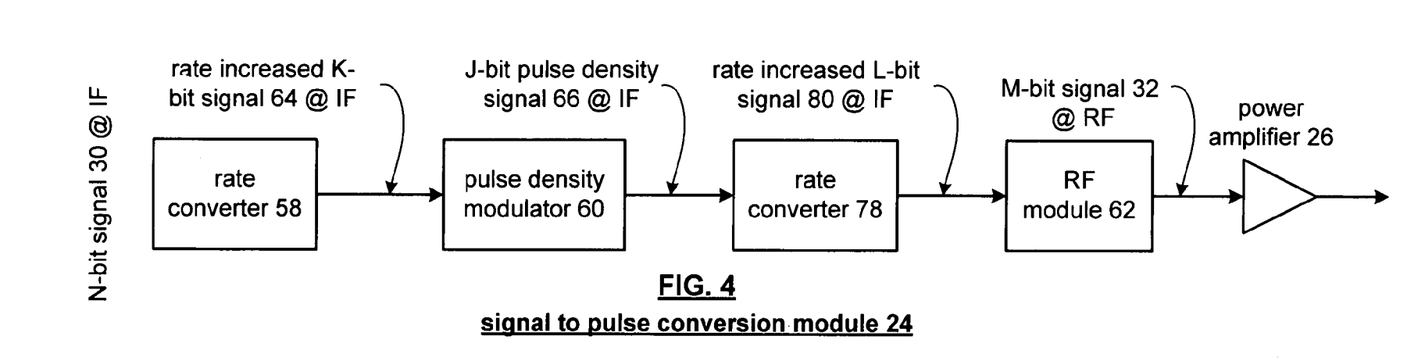
FIG. 4 illustrates a schematic block diagram of an alternate signal-to-pulse conversion module in accordance with the present invention.

FIG. 4 illustrates a schematic block diagram of an alternate embodiment of the signal-to-pulse conversion module 24. This embodiment includes the rate converter 58, the pulse-density modulator 60, a $2^{nd}$ rate converter 78, and the RF module 62, which are coupled to power amplifier 26. The functionality of rate converter 58 and pulse-density modulator 60 are as previously described with reference to FIG. 3. The rate converter 78 is operably coupled to increase the rate of the J-bit pulse-density signal 66 to achieve a rate corresponding to the radio frequency. The RF module 62 up-converts the frequency of the rate increase L-bit signal 80 (where L ranges from 1 to 4) to produce the M-bit signal 32 at the radio frequency.

Figure 5:
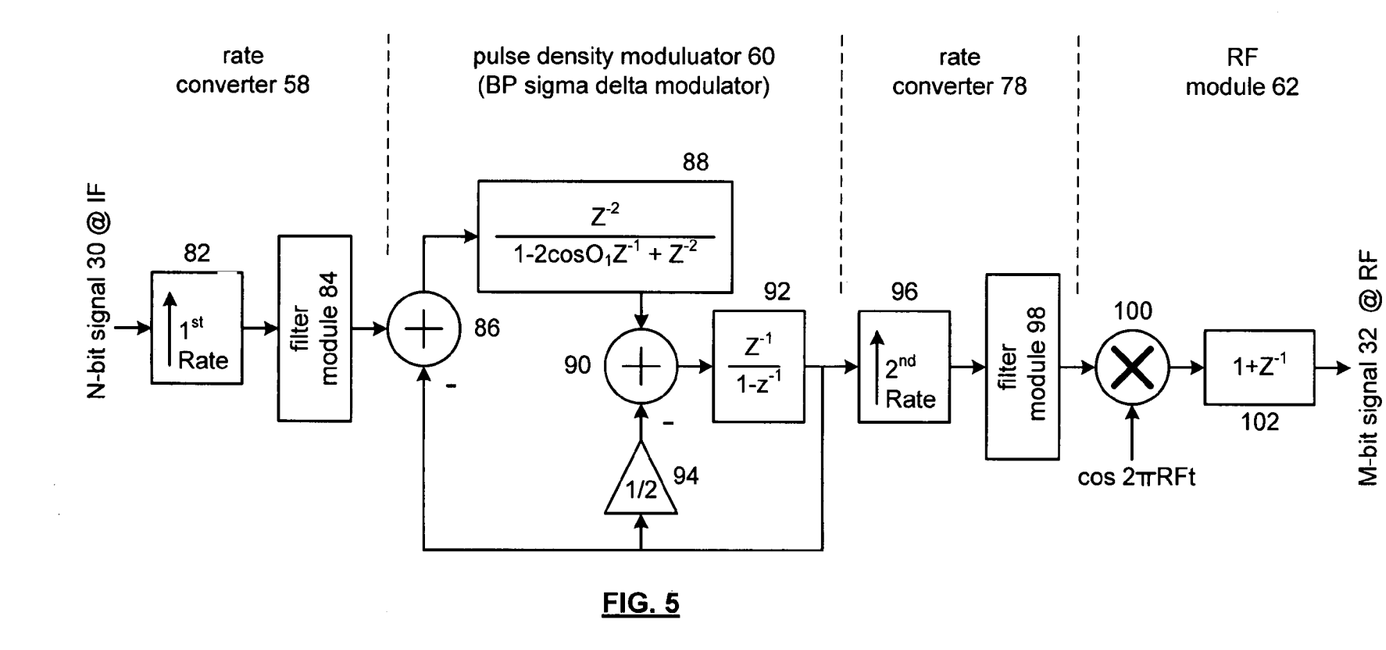
FIG. 5 illustrates a schematic block diagram of a detailed embodiment of the signal-to-pulse conversion module of FIG. 4.

FIG. 5 illustrates a detailed schematic block diagram of the signal-to-pulse conversion module 24 of FIG. 4. In this illustration, the rate converter 58 includes an over sampling module 82 that increases the rate of the N-bit signal 30 and further includes a filter module 84. In one embodiment, the filter module 84 is a sample and hold module, which, at a $1^{st}$ rate (e.g., 11×), samples and holds the over sampled N-bit signal to produce the rate increased K-bit signal 64 at the intermediate frequency.

The pulse-density modulator 60 is represented by a $2^{nd}$ order bandpass Sigma Delta modulator. But, as one of average skill in the art will appreciate, the pulse density modulator may be implemented as a low pass sigma delta modulator, third order sigma delta modulator, first order sigma delta modulator and any other type of pulse density modulator that quantizes an input signal into a small bit signal and pushes the quantization noise away from the signal frequency band.

In this illustration, the Sigma Delta modulator includes a summing module 86, a band-pass integrator module 88, a $2^{nd}$ summing module 90, an integrator module 92 and a divider 94. The $1^{st}$ summing module 86 is operably coupled to subtract a feedback signal from an input signal. In this illustration, the feedback signal is representative of the J-bit pulse-density signal 66 while the input signal corresponds to the rate increased K-bit signal 64. Note that the rate of the J-bit pulse density signal 66 substantially matches the rate of the rate increased K-bit signal 64.

The band-pass integrator module 88 integrates components of the output of the first summing module 86 within a band-pass region. The width of the band-pass region is dependent on the angle of $\theta_1$ in the denominator component.

The $2^{nd}$ summing module 90 subtracts a scaled representation of the feedback signal from the output of the band-pass integrator module 88. The integrator module 92 integrates the resultant of summing module 90 to produce the J-bit pulse-density signal 66. Accordingly, the Sigma Delta modulator is converting a digital signal into a 1 or 2 bit pulse-density signal.

Rate converter 78 includes an over sampling module 96 that over samples the M-bit pulse-density signal 66 at a $2^{nd}$ rate (e.g., 4). The rate converter 78 also includes a filter module 98. In one embodiment, the filter module 98 may be a sample and hold circuit that samples and holds the over sampled J-bit pulse-density signal 66 to produce the rate increased L-bit signal 80.

The RF module 62 includes a mixer 100 and a filter 102. The mixer 100 mixes the rate increased L-bit signal 80 with a cosine signal, which has a frequency corresponding to the RF frequency to produce a mixed RF signal. The filter 102 substantially eliminates the zero of the mixed RF signal such that few bits are needed at the output of filter 102 and, correspondingly, at the output of mixer 100. As one of average skill in the art will appreciate, the mixing module may mix a +1, 0, −1 or 0 in place of the cosine signal due to the over sampling and the square wave nature of the rate of the J-bit pulse-density signal 66. As such, the circuitry implementation of the RF module is considerably less complex than a cosine generator and a mixer. As one of average skill in the art will also appreciate, the filter 102 may be replaced by a $1+Z^{-3}$ filter.

Figure 6:
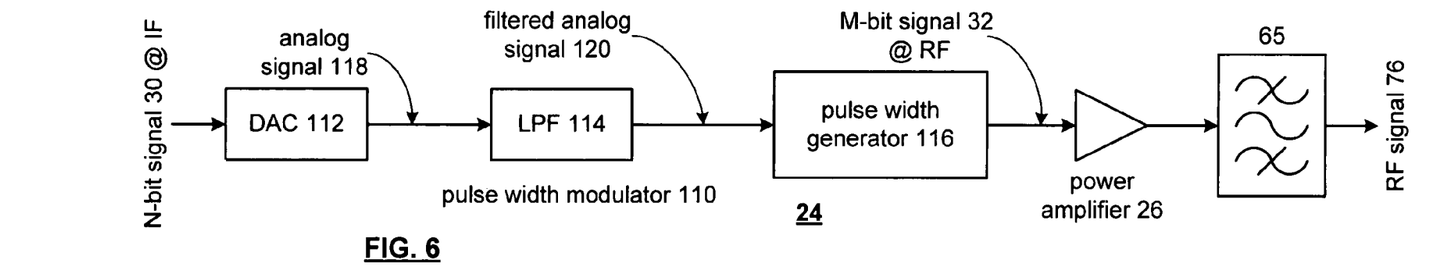
FIG. 6 illustrates a schematic block diagram of another signal-to-pulse conversion module in accordance with the present invention.

FIG. 6 illustrates a schematic block diagram of an alternate embodiment of the signal-to-pulse conversion module 24 that incorporates a pulse-width modulator 110. The pulse-width modulator 110 includes a digital-to-analog converter 112, a low pass filter 114, and a pulse-width generator 116. The digital-to-analog converter 112 is operably coupled to convert the N-bit signal 30 into an analog signal 118. The low pass filter 114 filters the analog signal 118 to produce a filtered analog signal 120.

The pulse-width generator 116 processes the filtered analog signal 120 with respect to a pulse-width signal (e.g., a sawtooth signal) to produce the M-bit signal 32 at the radio frequency. The power amplifier 26 amplifies the M-bit signal 32, which is subsequently band-pass filtered by band-pass filter 65. The pulse-width generator 116 may be implemented in a variety of ways including, but not limited to, those illustrated in FIGS. 7 and 8.

Figure 7:
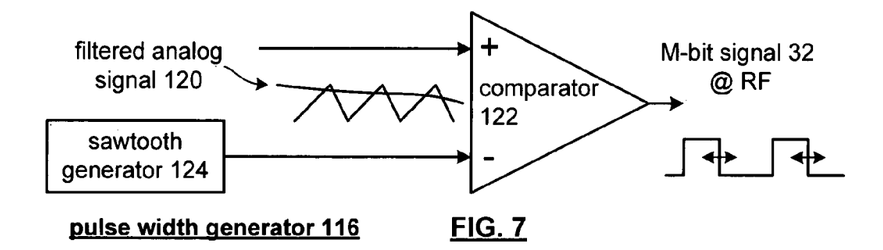
FIG. 7 illustrates a schematic block diagram of a pulse width generator in accordance with the present invention.

FIG. 7 illustrates a schematic block diagram of a pulse-width generator 116 that includes a comparator 122 and a saw tooth generator 124. The comparator 122 compares the filtered analog signal 120 with a saw tooth signal generated by the saw tooth generator 124. The rate of the saw tooth signal corresponds to the radio frequency. Accordingly, as the amplitude of the filtered analog signal 120 varies, the pulse-width of the M-bit signal 32 varies.

Figure 8:
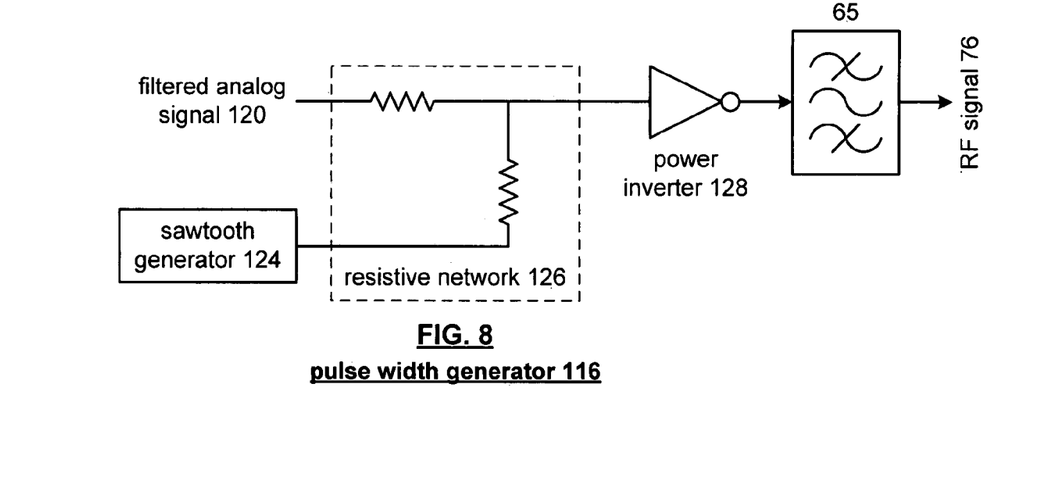
FIG. 8 illustrates a schematic block diagram of an alternate pulse width generator in accordance with the present invention.

FIG. 8 illustrates an alternate implementation of the pulse-width generator 116 that includes the saw tooth generator 124 and a resistive network 126, which is coupled to a power inverter 128. In this embodiment, the resistive network 126 sums the filtered analog signal 120 with a saw tooth signal, the resulting sum drives the power inverter 128. As the magnitude of the resultant signal exceeds the threshold voltage for the power inverter 128, the output of the power inverter 128 toggles, which is subsequently filtered via band-pass filter 65. With the rate of the sawtooth signal corresponding to the radio frequency, the resulting pulse width modulated signal is at RF.

Figure 9:
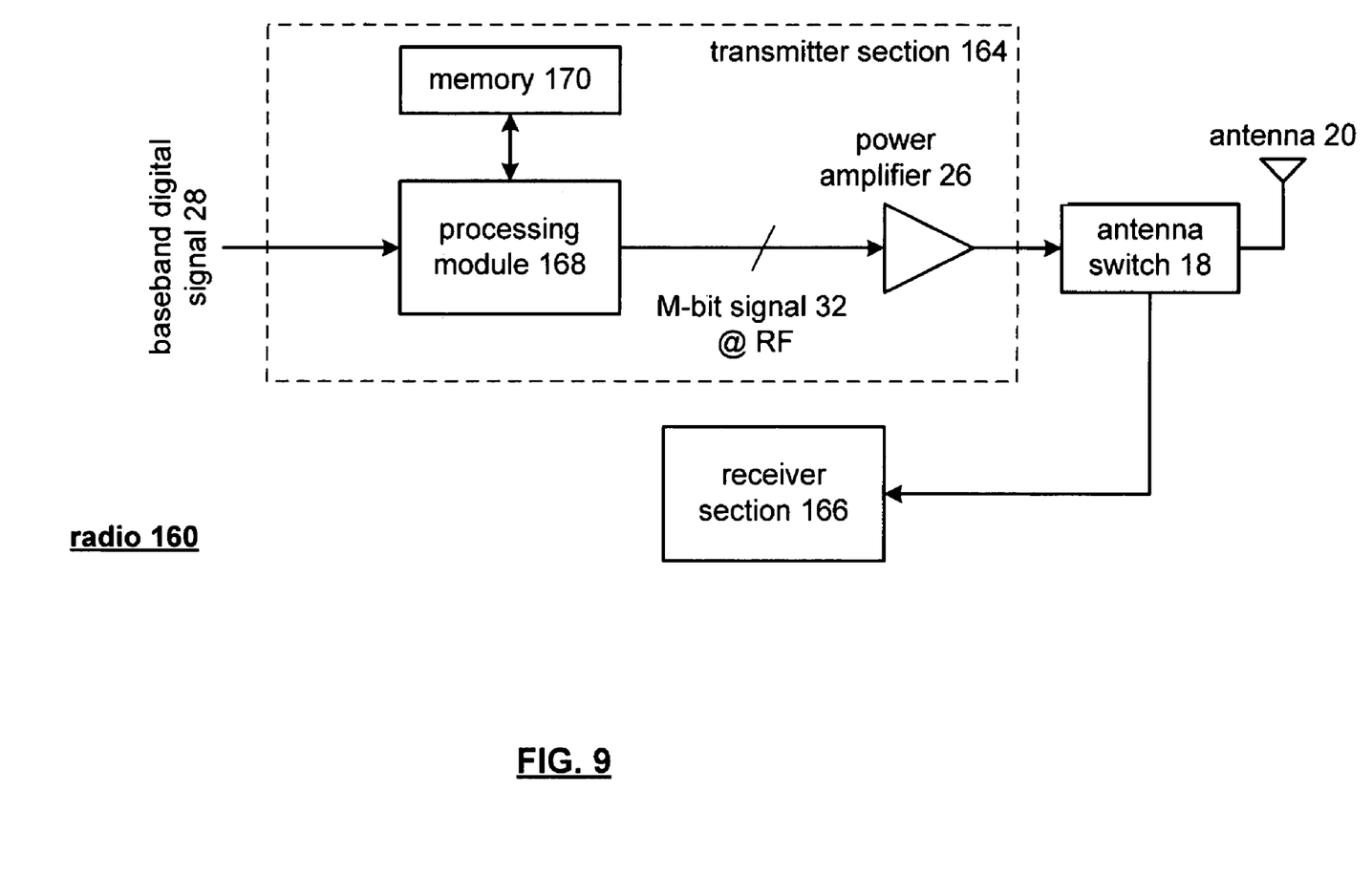
FIG. 9 illustrates a-schematic block diagram of an alternate radio in accordance with the present invention.

FIG. 9 illustrates an alternate schematic block diagram of a radio 160. The radio 160 includes a transmitter section 164, the antenna switch 18, antenna 20 and a receiver section 166. The transmitter section 164 includes a processing module 168, memory 170, the power amplifier 26, and the bandpass filter 65. The power amplifier may be implemented as a class A amplifier, as a power inverter, as a transistor pull-up and/or transistor pull-down circuit, or as a comparator which compares the M-bit signal with a reference signal, where the resulting comparison is an amplified version of the M-bit signal. The processing module 168 may be a single processing device or a plurality of processing devices. Such a processing device may be a microprocessor, micro-controller, digital signal processor, microcomputer, central processing unit, field programmable gate array, programmable logic device, state machine, logic circuitry, and/or any device that manipulates signals (analog and/or digital) based on operational instructions. The memory 170 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 168 implements one or more of its functions via a state machine or logic circuitry, the memory storing the corresponding operational instructions is embedded with the circuitry comprising the state machine or logic circuitry. The memory 170 stores, and the processing module 168 executes, operational instructions corresponding to at least some of the steps illustrated in FIG. 10.

Figure 10:
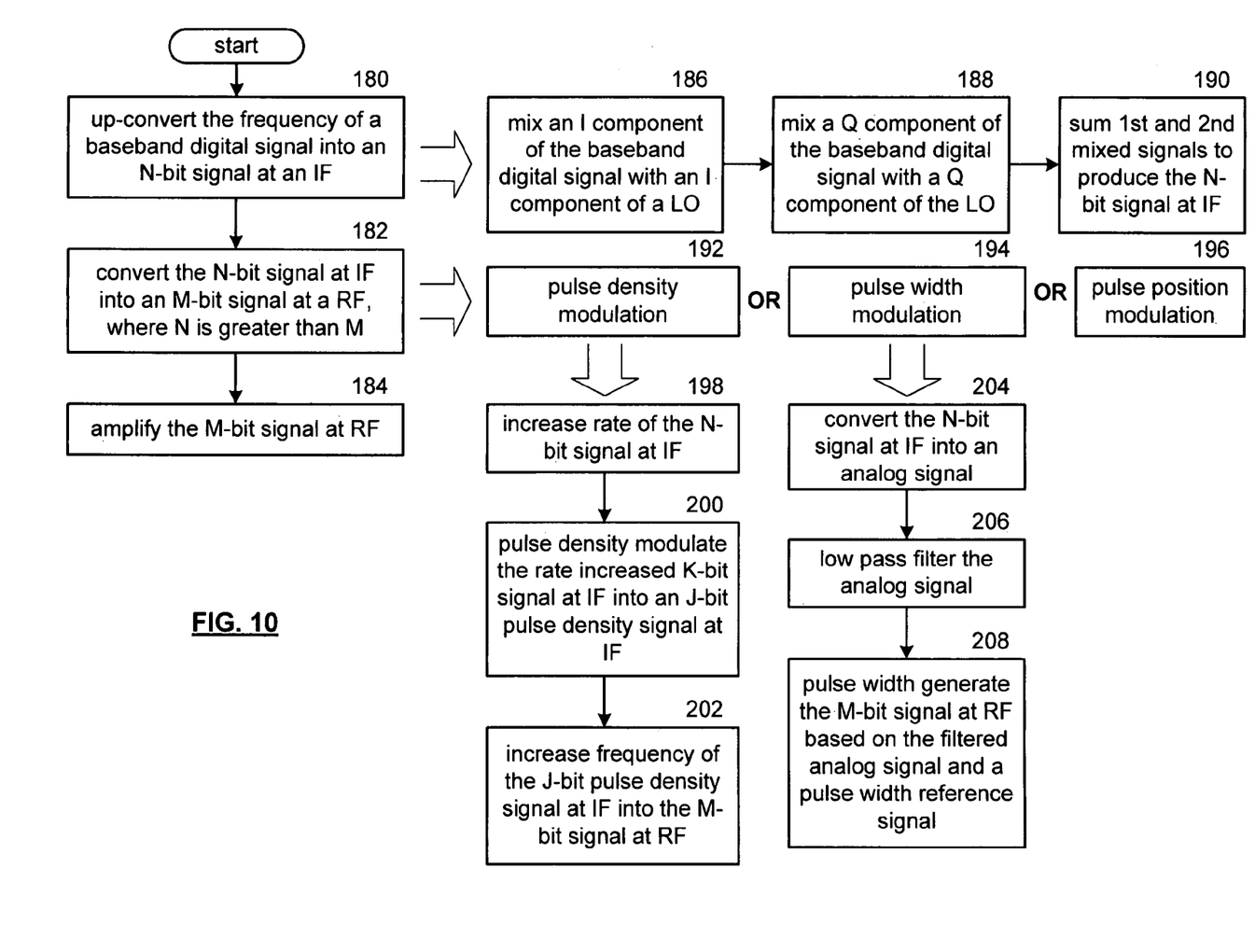
FIG. 10 illustrates a logic diagram of a method for transmitting radio frequency signals in accordance with the present invention.

FIG. 10 illustrates a logic diagram of a method for transmitting RF signals in accordance with the present invention. The process begins at Step 180 where the frequency of a base-band digital signal is up-converted to produce an N-bit signal at an intermediate frequency. This may be done as illustrated in Steps 186-190. At Step 186, an I component of a base-band digital signal is mixed with an I component of a local oscillator, which has a period corresponding to 1 over the intermediate frequency, to produce a $1^{st}$ mixed signal. The process then proceeds to Step 188 where a Q component of the base-band digital signal is mixed with a Q component of the local oscillation to produce a $2^{nd}$ mixed signal. The process then proceeds to Step 190 where the $1^{st}$ and $2^{nd}$ mixed signals are summed to produce the N-bit signal at the intermediate frequency.

Returning to the main flow of the diagram, the process proceeds to Step 182 where the N-bit signal at the intermediate frequency is converted to an M-bit signal at an RF frequency. Note that N is greater than M where N may range from 4 to 32 bits and M may be 1 or 2. The conversion of the N-bit signal to the M-bit signal may be done by pulse-density modulation, as shown at Step 192, pulse-width modulation, as shown at Step 194, or pulse-position modulation, as shown at Step 196.

If the conversion is done using pulse-density modulation, the process proceeds to Step 198-202. At Step 198, the rate of the N-bit signal at the intermediate frequency is increased to produce a rate increased K-bit signal at the intermediate frequency. Increasing the rate of the K-bit signal may be done by over sampling it to produce an over sampled N-bit signal. The over sampled N-bit signal may then be sampled and held at a $1^{st}$ rate, which corresponds to the desired rate of increase, to produce the rate increased J-bit signal.

The process then proceeds to Step 200 where the rate increased K-bit signal is pulse-density modulated to produce an J-bit pulse-density signal, which is still at the intermediate frequency. The pulse-density modulation may be done by sigma delta modulation, which begins the modulation process by subtracting a feedback signal from an input signal to produce a $1^{st}$ resultant. The feedback signal corresponds to the J-bit pulse-density signal and the input signal corresponds to the rate increased K-bit signal. The sigma delta modulation continues by band-pass integrating components of the $1^{st}$ resultant in a band-pass region to produce a band-pass integrated signal. The sigma delta modulation then continues by subtracting a $2^{nd}$ feedback signal from the band-pass integrated signal to produce a $2^{nd}$ resultant. The $2^{nd}$ feedback-signal corresponds to a scaled version of the J-bit pulse-density signal. The sigma delta modulation then continues by integrating the $2^{nd}$ resultant to produce the J-bit pulse-density signal.

After pulse-density modulating the K-bit signal to produce the J-bit pulse density signal, the process proceeds to Step 202 where the frequency of the J-bit pulse-density signal is increased from the intermediate frequency to the radio frequency. Note that prior to increasing the frequency, the rate of the M-bit pulse-density signal may be further increased.

If the conversion of the N-bit signal into the M-bit pulse-density signal is done using pulse-width modulation, the processing proceeds to Step 204-206. At Step 204, the N-bit signal is converted into an analog signal. The process then proceeds to Step 206 where the analog signal is low pass filtered to produce a filtered analog signal. The process then proceeds to Step 208 where the M-bit signal at the radio frequency is generated as a pulse-width modulated signal based on a comparison of the filtered signal with a pulse-width reference signal (e.g., a saw tooth signal).

Having converted the N-bit signal at the intermediate frequency into an M-bit signal at an RF frequency, the process proceeds to Step 184 where the M-bit signal at the radio frequency is amplified. Once the signal is amplified, it may be band-pass filtered at the radio frequency and subsequently provided to an antenna for transmission.

The preceding discussion has presented a transmitter and receiver that utilize pulse-encoded signals to transceive data via an RF communication path. By utilizing pulse-encoded signals, the signals have a substantially square-wave waveform. As such, the peak-to-average ratio is approximately zero. Accordingly, power amplifiers within the transmitter section may be designed for a peak-to-average ratio of zero, which allows them to be more efficient, have greater operating range, be smaller—thus consuming less integrated real estate—and therefore are less costly. As one of average skill in the art will appreciate, other embodiments may be derived from the teaching of the present invention without deviating from the scope of the claims.

What is claimed is:

1. A radio transmitter comprises:
   intermediate frequency stage operably coupled to up-convert frequency of a baseband digital signal into an N-bit signal at an intermediate frequency;
   signal to pulse conversion module operably coupled to convert the N-bit signal at the intermediate frequency into an M-bit signal at a radio frequency, wherein N is greater than M, the signal to pulse conversion module including a frequency up-conversion stage that includes a mixer for mixing the N-Bit signal by a discrete-valued signal having a frequency that is based on the radio frequency; and
   power amplifier operably coupled to amplify the M-bit signal at the radio frequency.

2. The radio transmitter of claim 1, wherein the intermediate frequency stage further comprises:
   first mixing module operably coupled to mix an in-phase component of the baseband digital signal with an in-phase intermediate frequency signal to produce a first mixed signal;
   second mixing module operably coupled to mix a quadrature component of the baseband digital signal with a quadrature intermediate frequency signal to produce a second mixed signal; and
   summing module operably coupled to sum the first and second mixed signals to produce the N-bit signal at the intermediate frequency.

3. The radio transmitter of claim 1, wherein the signal to pulse conversion module further comprises:
   pulse position modulator operably coupled to modulate the N-bit signal at the intermediate frequency with respect to a reference signal to produce the M-bit signal at the radio frequency.

4. The radio transmitter of claim 1, wherein the power amplifier comprises at least one of:
   comparator operably coupled to compare the M-bit signal at the radio frequency with a reference to produce an amplified M-bit signal;
   class A amplifier operably coupled to amplify the M-bit signal at the radio frequency;
   inverter operably coupled to invert the M-bit signal at the radio frequency; and
   transistor pull-up and pull-down circuit operably coupled to amplify the M-bit signal at the radio frequency.

5. The radio transmitter of claim 1 further comprises:
   ceramic bandpass filter operably coupled to bandpass filter an output of the power amplifier to produce a bandpass M-bit square wave signal; and
   an antenna operably coupled to transmit the bandpass M-bit square wave signal.

6. A method for radio frequency signal transmissions, the method comprises:
   up-converting frequency of a baseband digital signal into an N-bit signal at an intermediate frequency;
   converting the N-bit signal at the intermediate frequency into an M-bit signal at a radio frequency via a signal to pulse conversion module that includes a frequency up-conversion stage that includes a mixer for mixing the N-Bit signal by a discrete-valued signal having a frequency that is based on the radio frequency, wherein N is greater than M; and
   amplifying the M-bit signal at the radio frequency.

7. The method of claim 6, wherein the up-converting the frequency of the baseband signal further comprises:
   mixing an in-phase component of the baseband digital signal with an in-phase intermediate frequency signal to produce a first mixed signal;
   mixing a quadrature component of the baseband digital signal with a quadrature intermediate frequency signal to produce a second mixed signal; and
   summing the first and second mixed signals to produce the N-bit signal at the intermediate frequency.

8. The method of claim 6, wherein the converting of the N-bit signal at the intermediate frequency into the M-bit signal at a radio frequency further comprises:
   pulse position modulating the N-bit signal at the intermediate frequency with respect to a reference signal to produce the M-bit signal at the radio frequency.

9. The method of claim 6 further comprises:
   bandpass filtering the amplified M-bit signal at the radio frequency to produce a bandpass M-bit square wave signal; and
   providing the bandpass M-bit square wave signal to an antenna for transmission.

10. An apparatus for radio frequency signal transmissions, the apparatus comprises:
    processing module; and
    memory operably coupled to the processing module, wherein the memory includes operational instructions that cause the processing module to:
      up-convert frequency of a baseband digital signal into an N-bit signal at an intermediate frequency;
      convert the N-bit signal at the intermediate frequency into an M-bit signal at a radio frequency that includes a frequency up-conversion stage that includes a mixer for mixing the N-Bit signal by a discrete-valued signal having a frequency that is based on the radio frequency, wherein N is greater than M; and
      amplify the M-bit signal at the radio frequency.

11. The apparatus of claim 10, wherein the memory further comprises operational instructions that cause the processing module to up-convert the frequency of the baseband signal by:
    mixing an in-phase component of the baseband digital signal with an in-phase intermediate frequency signal to produce a first mixed signal;
    mixing a quadrature component of the baseband digital signal with a quadrature intermediate frequency signal to produce a second mixed signal; and summing the first and second mixed signals to produce the N-bit signal at the intermediate frequency.

12. The apparatus of claim 10, wherein the memory further comprises operational instructions that cause the processing module to convert the N-bit signal at the intermediate frequency into the M-bit signal at a radio frequency by:

pulse position modulating the N-bit signal at the intermediate frequency with respect to a reference signal to produce the M-bit signal at the radio frequency.

13. The apparatus of claim 10, wherein the memory further comprises operational instructions that cause the processing module to:

bandpass filter the amplified M-bit signal at the radio frequency to produce a bandpass M-bit square wave signal; and provide the bandpass M-bit square wave signal to an antenna for transmission.

* * * * *